(12) United States Patent
Azdasht

(10) Patent No.: US 10,118,240 B2
(45) Date of Patent: Nov. 6, 2018

(54) METHOD FOR FORMING SOLDER DEPOSITS

(71) Applicant: Pac Tech—Packaging Technologies GmbH, Nauen (DE)

(72) Inventor: Ghassem Azdasht, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 0 days.

(21) Appl. No.: 15/658,084

(22) Filed: Jul. 24, 2017

(65) Prior Publication Data
US 2017/0320155 A1   Nov. 9, 2017

Related U.S. Application Data

(62) Division of application No. 13/641,497, filed as application No. PCT/DE2011/000394 on Apr. 13, 2011, now abandoned.

(30) Foreign Application Priority Data

Apr. 16, 2010   (DE) .......................... 10 2010 015 520

(51) Int. Cl.
*B23K 26/00*   (2014.01)
*H01L 21/00*   (2006.01)
(Continued)

(52) U.S. Cl.
CPC .............. *B23K 1/20* (2013.01); *B23K 1/0056* (2013.01); *B23K 3/06* (2013.01); *B23K 3/0607* (2013.01);
(Continued)

(58) Field of Classification Search
CPC . H01L 2924/00013; H01L 2924/13099; H01L 2924/014; H01L 2924/01068;
(Continued)

(56) References Cited

U.S. PATENT DOCUMENTS 5,833,128 A * 11/1998 Kloeser ................... H01L 24/10
228/180.22
6,353,209 B1 * 3/2002 Schaper ............ H01L 21/67103
118/725
(Continued)

FOREIGN PATENT DOCUMENTS

JP          06021147 A  *  1/1994

OTHER PUBLICATIONS

Machine translation of JP 06021147.*

*Primary Examiner* — Michael G Hoang
(74) *Attorney, Agent, or Firm* — Quarles & Brady LLP

(57) ABSTRACT

A method for forming solder deposits on elevated contact metallizations of terminal faces of a substrate formed in particular as a semiconductor component includes bringing wetting surfaces of the contact metallizations into physical contact with a solder material layer. The solder material is arranged on a solder material carrier. At least for the duration of the physical contact, a heating of the substrate and a tempering of the solder material layer takes place. Subsequently a separation of the physical contact between the contact metallizations wetted with solder material and the solder material layer takes place.

9 Claims, 3 Drawing Sheets

(51) Int. Cl.
*B23K 1/20* (2006.01)
*B23K 1/005* (2006.01)
*B23K 3/06* (2006.01)
*H01L 21/683* (2006.01)
*H01L 23/00* (2006.01)

(52) U.S. Cl.
CPC .......... *H01L 21/6835* (2013.01); *H01L 24/11* (2013.01); *H01L 24/742* (2013.01); *H01L 24/06* (2013.01); *H01L 24/13* (2013.01); *H01L 24/16* (2013.01); *H01L 2224/0401* (2013.01); *H01L 2224/11002* (2013.01); *H01L 2224/11003* (2013.01); *H01L 2224/11822* (2013.01); *H01L 2224/13099* (2013.01); *H01L 2224/7515* (2013.01); *H01L 2924/00* (2013.01); *H01L 2924/00013* (2013.01); *H01L 2924/014* (2013.01); *H01L 2924/01058* (2013.01); *H01L 2924/01068* (2013.01); *H01L 2924/12042* (2013.01)

(58) Field of Classification Search
CPC . H01L 2924/01058; H01L 2924/12042; H01L 2924/00; H01L 2224/11822; H01L 2224/0401; H01L 2224/13099; H01L 2224/17515; H01L 2224/11003; H01L 2224/11002; H01L 2224/10; H01L 2224/11001; H01L 2224/11011; H01L 24/742; H01L 24/11; H01L 24/06; H01L 24/16; H01L 24/13; H01L 21/6835; H01L 21/00; B23K 1/0056; B23K 1/20; B23K 3/06; B23K 3/0607; B23K 26/00
USPC .............. 219/121.64, 121.6, 121.65, 121.66, 219/121.85, 200, 386; 228/256, 33; 156/272.8
See application file for complete search history.

(56) References Cited

U.S. PATENT DOCUMENTS

| | | | | |
|---|---|---|---|---|
| 6,713,714 | B1* | 3/2004 | Azdasht | ............... B23K 1/0056 |
| | | | | 156/272.8 |
| 6,955,943 | B2* | 10/2005 | Zakel | .................. H01L 21/6835 |
| | | | | 257/E21.508 |
| 2007/0119618 | A1* | 5/2007 | Nishitani | .......... H01L 23/49811 |
| | | | | 174/260 |
| 2008/0268560 | A1* | 10/2008 | Ploessl | ................ H01L 33/0079 |
| | | | | 438/29 |

* cited by examiner

METHOD FOR FORMING SOLDER DEPOSITS

CROSS-REFERENCE TO RELATED APPLICATIONS

This application is a divisional application of U.S. patent application Ser. No. 13/641,497, which application represents the national stage entry of PCT International Application No. PCT/DE2011/000394 on Apr. 13, 2011 and claims the benefit of German Patent Application No. DE 10 2010 015 520.9 filed Apr. 16, 2010. The contents of each of these applications are hereby incorporated by reference as if set forth in their entirety herein.

STATEMENT REGARDING FEDERALLY SPONSORED RESEARCH OR DEVELOPMENT

Not applicable.

FIELD OF THE INVENTION

The present invention relates to a method as well as a device for forming solder deposits on elevated contact metallizations of terminal faces of a substrate in particular formed as a semiconductor component, in which wetting surfaces of the contact metallizations are brought into physical contact with a solder material layer arranged on a solder material carrier, at least for the duration of the physical contact a heating of the contact metallizations of the substrate and a tempering of the solder material layer takes place, and subsequently a separation of the physical contact between the contact metallizations wetted with solder material and the solder material layer takes place.

BACKGROUND OF THE INVENTION

In particular for the contacting of semiconductor components, such as chips in the so-called flip chip process, in which the semiconductor components are bonded with their terminal faces directly to the terminal faces of contact substrates, the semiconductor components are regularly equipped with elevated contact metallizations (bumps), which on their surface comprise a solder deposit in order to establish an electrically conductive and mechanically durable connection of the semiconductor components with the contact substrates by melting the solder deposits. The contact metallizations herein provide an exposed configuration of the joints defined by the solder deposits.

The formation or application of solder deposits on the contact metallizations can be done in different ways. For example, it is known to galvanically apply solder deposits, wherein the use of this method requires an adequate masking of the surface of the semiconductor component, such that the known method is correspondingly intricate. It is also known to apply solder deposits onto elevated contact metallizations via sputtering, wherein said method also requires a laborious masking of the surface of the semiconductor component.

In comparison, a method proves less laborious in which the contact metallizations with their wetting surfaces are dipped in molten solder material, which after removal of the contact metallizations from the solder material bath forms the intended solder material deposits by solidification.

However, the implementation of this per se inexpensive method proves problematic when said semiconductor components are to be equipped with solder deposits with a terminal face pattern of a particularly fine pitch, such that the individual terminal faces or the contact metallizations formed on the terminal faces only have a very small distance from each other. These spaces between the contact metallizations are often somewhere in the region of 10 μm. In the case of such small spaces a formation of contact bridges between the solder deposits of neighboring contact metallizations can occur due to the surface tension of the molten solder material. Since in the operational use of the semiconductor components this inevitably leads to component failure, semiconductor components which exhibit such contact defects must be discarded as scrap in the course of quality management. This may lead to significant economic losses.

SUMMARY OF THE INVENTION

Therefore the present invention has the object of proposing a method and a device which enable forming solder deposits on elevated contact metallizations of terminal faces of a substrate with a diminished scrap risk.

In the method according to the invention wetting surfaces of the contact metallizations of the substrate are brought into physical contact with a solder material layer arranged on a solder material carrier, wherein at least for the duration of the physical contact a heating of the contact metallizations of the substrate and a tempering of the solder material layer takes place, and subsequently a separation of the physical contact between the contact metallizations wetted with solder material and the solder material layer takes place.

Due to the inventive tempering of the solder material layer during the heating of the contact metallizations it is precluded that the heating of the contact metallizations leads to a complete melting of the solder material layer. Instead, melting together with a corresponding wetting of the wetting surfaces only occurs in isolated, local areas of the solder material layer that are defined by the wetting surfaces. Between the wetting surfaces of the contact metallizations areas remain in the solder material layer which are not molten in contrast to the areas of the solder material layer which are positioned opposite of the wetting surfaces of the contact metallizations.

Hereby it can be precluded that a forming of contact bridges between neighboring contact metallizations occurs in case of a separation of the physical contact between the wetting surfaces of the contact metallizations and the solder material layer due to the surface tension of molten solder material. Rather, by the isolated or partial melting of the solder material layer the molten areas are released from the solder material layer due to the wetting forces and the non-molten areas of the solder material layer remain on the solder material layer carrier.

It has proven particularly advantageous if during the formation of the physical contact of the solder material layer at least the contact metallizations are disposed in a protective medium atmosphere in order to preclude an oxidation of the contact metallizations or the wetting surfaces of the contact metallizations.

If the creation of the protective medium atmosphere is effected by applying a flux layer to the solder material layer, creating the protective medium atmosphere can be achieved with the least possible effort.

It is particularly advantageous in view of a contacting of the semiconductor component with a contact substrate directly following the formation of solder deposits on the contact metallizations if the contacting of the contact metallizations with the solder material layer and the separation of the contact metallizations from the solder material layer is performed by means of an approach or retreat motion of the substrate because the retreat motion of the substrate can simultaneously be used to bring the substrate into a desired position relative to a contact substrate for a subsequent contacting.

It is also particularly advantageous if for performing the approach and retreat motion the substrate is accommodated in a handling device, which at the same time serves the purpose of applying laser energy to the substrate, such that one and the same handling device can be used for forming the solder deposits on the contact metallizations as well as for a subsequent contacting of the substrate provided with the solder deposits to a contact substrate. Herein the same heating device, particularly the laser device which is used for forming the solder deposits, can also be used for performing the contacting process. Further it is possible to leave the solder deposits in a molten state right after their formation in order to be able to energy-efficiently perform a subsequent contacting without having to re-melt the solder deposits.

If the tempering of the solder material layer is performed via a temperable carrier platform accommodating the solder material layer it is possible to optimize the solder material layer on the one hand and the carrier platform on the other hand in terms of their different functions instead of forming the solder material carrier so as to ensure not only the provisioning function for the solder material layer, but also the tempering function as it would be the case if the solder material carrier were simultaneously used for the tempering. Notwithstanding this, it is of course also conceivable to form a carrier platform which on the one hand is temperable and on the other hand comprises a special surface or surface coating which is advantageous for the provision of the solder material layer.

For forming the solder material layer, the solder material carrier can be formed with a layer of a fluid or pasty solder material or of solder material molded bodies, wherein in particular in the latter case it is advantageous if the solder material molded bodies have a diameter which is smaller than the distance between the contact metallizations of the substrate in order to preclude that due to a simultaneous contact between a solder material molded body and two neighboring contact metallizations a formation of a contact bridge can occur.

The device according to the invention comprises an accommodating device for accommodating the substrate, a heating device for heating the substrate and a carrier platform for providing a solder material layer disposed on a solder material carrier, wherein the carrier platform is equipped with a tempering device for tempering the solder material layer and a feeding device serving the purpose of performing an approach and a retreat motion, such that the formation of a physical contact between elevated contact metallizations of the substrate and the solder material layer with subsequent separation of the physical contact is made possible.

It is particularly advantageous if the accommodating device is formed by a handling device which is equipped with a laser device for applying laser energy to the substrate.

The handling device can serve the purpose of performing the approach and retreat motion; however, it is also particularly advantageous if the carrier platform is equipped with a feeding device for performing the approach and retreat motion.

A particularly compact embodiment of the device is made possible if the carrier platform is also formed as a tempering device.

In view of a modular design of the device it is advantageous if the tempering device is formed independent of the carrier platform, since thereby the possibility is basically given to combine different tempering devices with one and the same carrier platform.

In the following a preferred embodiment of the method according to the invention and a device used in the implementation of the method are described in more detail on the basis of the drawings.

DETAILED DESCRIPTION OF THE EXAMPLE EMBODIMENTS

Figure 1:
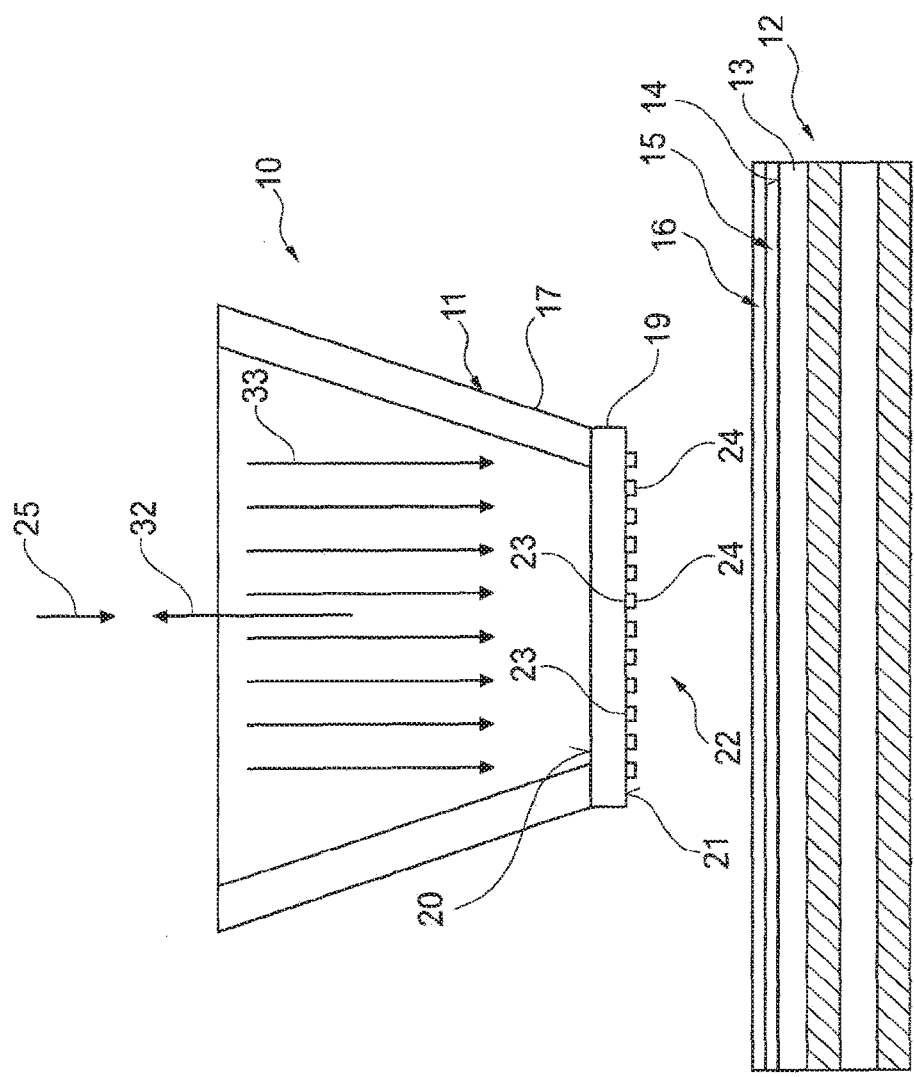
FIG. 1 shows a device for forming solder deposits in a feeding phase.

FIG. 1 shows a device 10 for forming solder deposits with a handling device 11 and a carrier platform 12 arranged below the handling device 11, the carrier platform 12 serving the purpose of accommodating a solder material carrier 13 on whose surface 14 a solder material layer 15 is disposed which in the case of the embodiment shown in FIG. 1 is formed from a pasty solder material mass. The solder material layer 15 in the present case is covered by a flux coating 16 for protection against its environment.

The handling device 11 comprises a lower mouthpiece formed as an accommodating device 17 with an abutting surface 18 which is formed by a frame-like opening edge and serves the purpose of supporting a substrate 19 which is held at the mouthpiece 17 by applying negative pressure and which is here formed as a semiconductor component. For creating the negative pressure the handling device 11 is equipped with a negative pressure device not illustrated here, which applies a corresponding negative pressure force 32 to a rear side 20 of the semiconductor component, such that the rear side 20 rests fixed against an abutting surface 18.

In the embodiment shown in FIG. 1 the semiconductor component 19 is a chip which comprises on its contact side 21 opposite of its rear side 20 a terminal face array 22 on whose individual terminal faces 23 respectively one elevated contact metallization 24, in technical terms also called bump, is formed.

The configuration of the device 10 for forming solder deposits shown in FIG. 1 shows the handling device 11, arranged above the carrier platform 12, in a feeding phase in which the semiconductor component 19 is moved towards the carrier platform 12 by an approach motion 25 of a feeding device, such as the mouthpiece 17. Already during said approach motion as shown in FIG. 1 energy can be applied to the rear side of the semiconductor component 19, which leads to a heating of the semiconductor component 19. In the present case, the energy applied to the semiconductor component 19 is laser energy 33.

Figure 2:
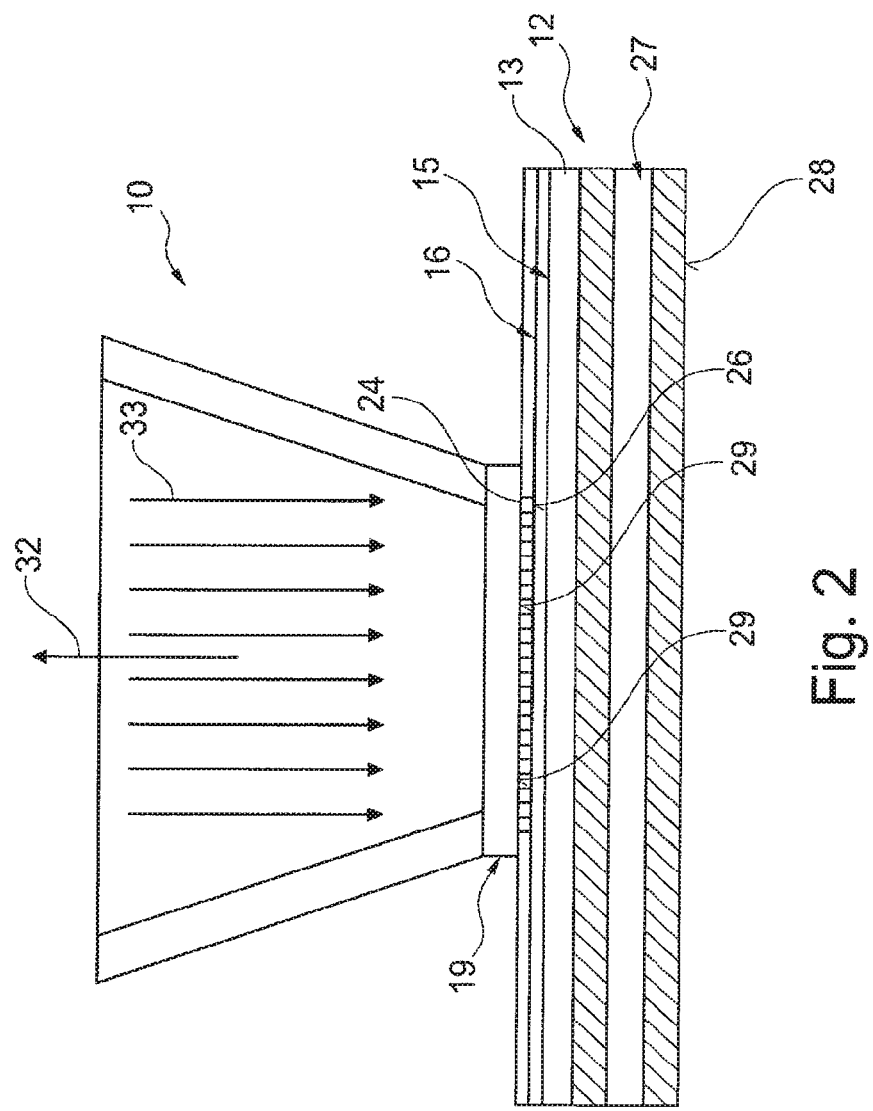
FIG. 2 shows a device for forming solder deposits in a wetting phase.

FIG. 2 shows the device 10 for forming solder deposits in a wetting phase following the feeding phase, in which wetting surfaces 26 of the contact metallizations 24 are in physical contact with the solder material layer 15 and therein are protected from their environment by the flux coating 16.

If the rear side of the semiconductor component 19 is not impinged with laser energy 33 already during the feeding phase as shown in FIG. 1, now at the latest in the wetting phase shown in FIG. 2 energy impingement from the rear takes place such that via heat conduction through the semiconductor component 19 a heating of the contact metallizations 24 takes place. Simultaneously with the heating of the contact metallizations 24 a cooling of the solder material layer 15 formed on the solder material carrier 13 takes places by means of a corresponding tempering of the carrier platform 12 via a tempering device 27 formed in this case in the carrier platform 12. For forming the tempering device 27 a coolant line not illustrated here can for example be formed in the carrier platform 12. Notwithstanding this, it is also possible to provide a tempering device 36 being separate from the carrier platform 12, which can for example be formed by a cooling plate which is brought into contact with the underside 28 of the carrier platform 12.

Irrespective of the way in which a cooling of the solder material layer 15 disposed on the solder material carrier 13 is implemented, the cooling of the solder material layer 15 taking place during the heating of the semiconductor component 19 has the effect that a melting of the solder material layer 15 only occurs in the contact areas between the wetting surfaces 26 and the solder material layer 15 and that in the areas of the solder material layer 15 that are disposed opposite of spaces between the contact metallizations 29 melting does not occur or at least a lower degree of liquefaction of the solder material layer 15 occurs in comparison to the areas opposite of the wetting surfaces 26.

Figure 3:
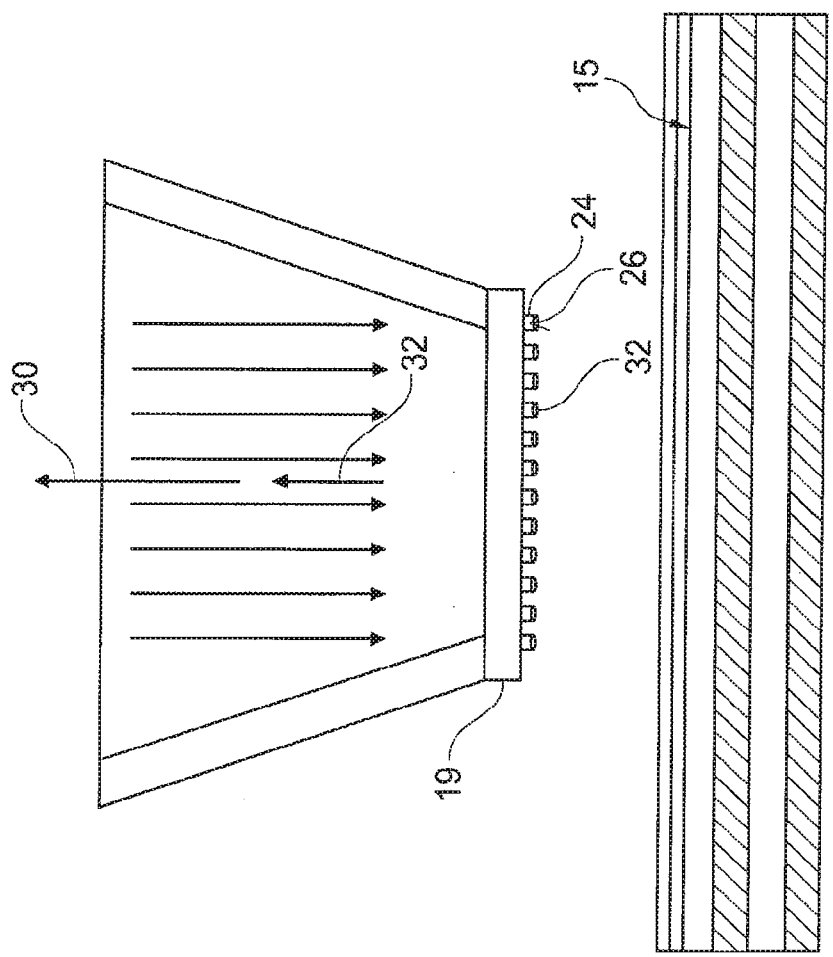
FIG. 3 shows the device for forming solder deposits in a solidifying phase.

FIG. 3 shows a solidifying phase following the wetting phase illustrated in FIG. 2. In said solidifying phase the contact metallizations 24 are brought out of contact with the solder material layer 15 by a retreat motion 32 of the mouthpiece 17 and on the wetting surfaces 26 of the contact metallizations 24 solder material menisci, which have formed as a result of the wetting, form solder deposits 34. Depending on whether or not a heating of the semiconductor component 19 continues to take place in the configuration of the device for forming solder deposits illustrated in FIG. 3, the liquid state of the solder deposits 34 can be maintained or the solder deposits can be brought into a solid state.

The invention claimed is:

1. A method for forming metallic solder deposits on fine pitch elevated contact metallizations formed on a substrate of a semiconductor component, comprising the steps of:
   bringing wetting surfaces of the contact metallizations into physical contact with a solder material layer,
   simultaneously heating the substrate and cooling the metallic solder material layer during the physical contact, and
   subsequently separating the contact metallizations from the metallic solder material layer, wherein the contact metallizations are wetted with solder material.

2. The method according to claim 1, further comprising the step of disposing the contact metallizations in a protective medium during the physical contact with the solder material layer.

3. The method according to claim 2, wherein the protective medium comprises a flux layer applied onto the solder material layer.

4. The method according to claim 1, further comprising the step of moving the solder material layer into and out of contact with the contact metallizations by an approach and a retreat motion of the substrate, respectively.

5. The method according to claim 1, wherein the step of heating the substrate comprises applying laser energy to the substrate.

6. The method according to claim 1, further comprising the step of mounting the solder material layer to a carrier platform comprising a cooling device.

7. The method according to claim 1, further comprising the step of forming the solder material layer as a layer of molded bodies of solder material on a solder material carrier.

8. The method according to claim 7, wherein the solder material molded bodies have a diameter which is smaller than the distance between each of the contact metallizations and a neighboring one of the contact metallizations of the substrate.

9. The method of claim 1, wherein the semiconductor component is a flip chip.

* * * * *